United States Patent
Fujita et al.

(10) Patent No.: US 8,350,319 B2
(45) Date of Patent: Jan. 8, 2013

(54) SEMICONDUCTOR DEVICE

(75) Inventors: Shigeto Fujita, Tokyo (JP); Khalid Hassan Hussein, Tokyo (JP); Junichi Yamashita, Tokyo (JP); Hisao Kondo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 108 days.

(21) Appl. No.: 13/078,436

(22) Filed: Apr. 1, 2011

(65) Prior Publication Data

US 2012/0012947 A1     Jan. 19, 2012

(30) Foreign Application Priority Data

Jul. 15, 2010   (JP) .................................. 2010-160544

(51) Int. Cl.
*H01L 29/66* (2006.01)
*H01L 21/336* (2006.01)

(52) U.S. Cl. ....................................... 257/329; 438/268

(58) Field of Classification Search .................. 438/212, 438/259, 268–274; 257/328–332, E29.318, 257/E29.262
See application file for complete search history.

(56) References Cited

U.S. PATENT DOCUMENTS

| 6,146,947 A * | 11/2000 | Okabe et al. .................. 438/268 |
| 6,831,331 B2 * | 12/2004 | Kitamura et al. .............. 257/343 |
| 8,184,075 B2 * | 5/2012 | Sagawa et al. .................. 345/76 |

FOREIGN PATENT DOCUMENTS

JP        2010-123774        6/2010

\* cited by examiner

*Primary Examiner* — Calvin Lee
(74) *Attorney, Agent, or Firm* — Oblon, Spivak, McClelland, Maier & Neustadt, L.L.P.

(57) ABSTRACT

A semiconductor device includes a gate pad, a gate wiring conductor connected to the gate pad, and a gate electrode formed under the gate pad and the gate wiring conductor. Portions of the gate electrode closer to the gate pad have a higher resistance per unit area than portions of the gate electrode farther away from the gate pad.

3 Claims, 5 Drawing Sheets

SEMICONDUCTOR DEVICE

BACKGROUND OF THE INVENTION

1. Field of the Invention

The present invention relates to a semiconductor device in which a voltage is applied to the gate electrode through a gate pad.

2. Background Art

Japanese Laid-Open Patent Publication No. 2010-123774 discloses a semiconductor device in which a voltage is applied to the gate electrode through a gate pad. In this semiconductor device, the resistance between the gate pad and the gate electrode (which resistance may be hereinafter referred to as the gate resistance) is reduced, as compared to conventional semiconductor devices. Specifically, the wiring conductor connecting the gate pad with the gate electrode is for the most part made of Al (which has a low resistivity) to reduce the gate resistance. It should be noted that the switching speed of a semiconductor device can be increased by reducing the gate resistance.

It has been found, however, that a reduction in the gate resistance may result in the formation of a Hartley oscillator circuit in the semiconductor device, which circuit is formed by the gate-collector capacitance and the inductances of the bus bar and wires, etc. Such formation of a Hartley oscillator circuit in a semiconductor device may cause high frequency oscillation and electromagnetic wave radiation and thereby prevent the desired gate control.

It should be noted that the gate resistance may be increased to prevent "short-circuit oscillation," which term refers to oscillation of a Hartley oscillator circuit. However, an increase in the gate resistance results in a decrease in the switching speed of the semiconductor device.

SUMMARY OF THE INVENTION

The present invention has been made to solve the above problems. It is, therefore, an object of the present invention to provide a semiconductor device which exhibits reduced short-circuit oscillation yet has a high switching speed.

According to one aspect of the present invention, a semiconductor device includes a gate pad, a gate wiring conductor connected to the gate pad, and a gate electrode formed under the gate pad and the gate wiring conductor. Portions of the gate electrode closer to the gate pad have a higher resistance per unit area than portions of the gate electrode farther away from the gate pad.

Other and further objects, features and advantages of the invention will appear more fully from the following description.

DETAILED DESCRIPTION OF THE PREFERRED EMBODIMENT

Embodiment

Figure 1:
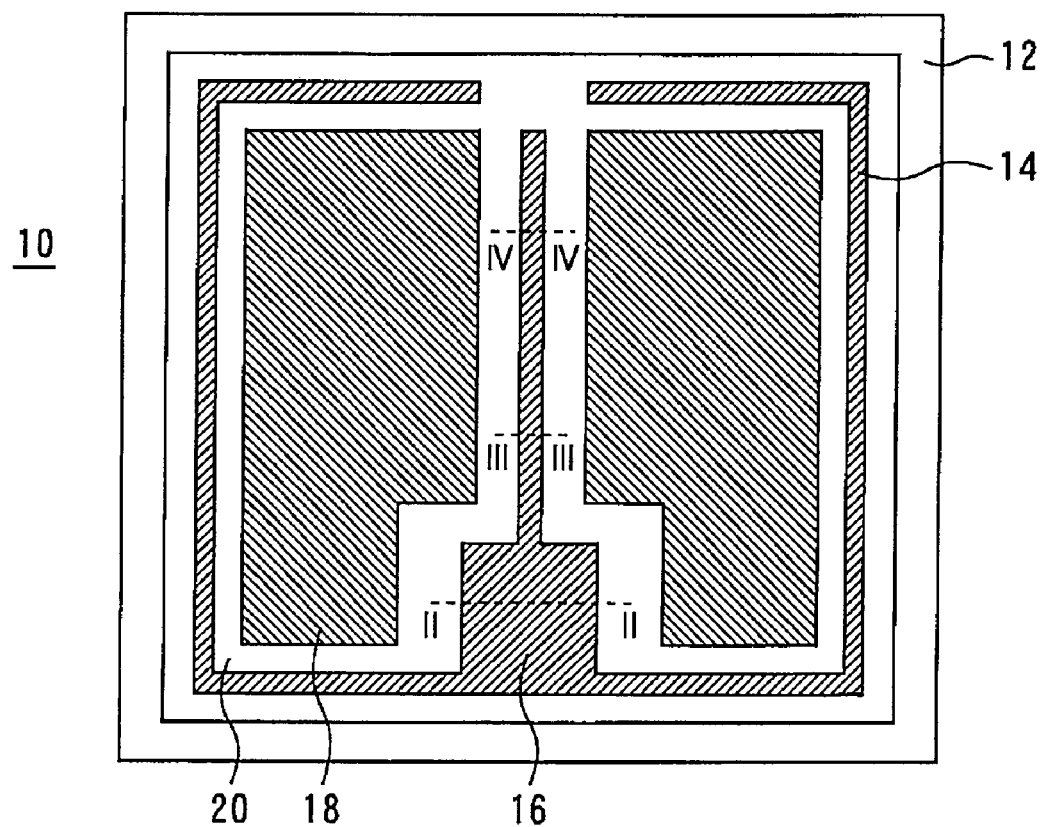
FIG. 1 is a plan view of a semiconductor device in accordance with an embodiment of the present invention.

FIG. 1 is a plan view of a semiconductor device 10 in accordance with an embodiment of the present invention. The semiconductor device 10 is a power MOSFET and includes a dielectric strength enhancing region 12. The dielectric strength enhancing region 12 is an annular structure formed to enhance the dielectric strength of the semiconductor device 10. A gate wiring conductor 14 is formed in the area defined by the annular dielectric strength enhancing region 12. The gate wiring conductor 14 is made of aluminum. A gate pad 16 is connected in contact with the gate wiring conductor 14. The gate pad 16 is made of the same material as the gate wiring conductor 14, but has a greater width than the gate wiring conductor 14 to accommodate wire bonding. Emitter pads 18 are also formed in the area defined by the annular dielectric strength enhancing region 12. Further, the insulating film 20 is formed to insulate the gate wiring conductor 14, the gate pad 16, and the emitter pads 18.

Figure 2:
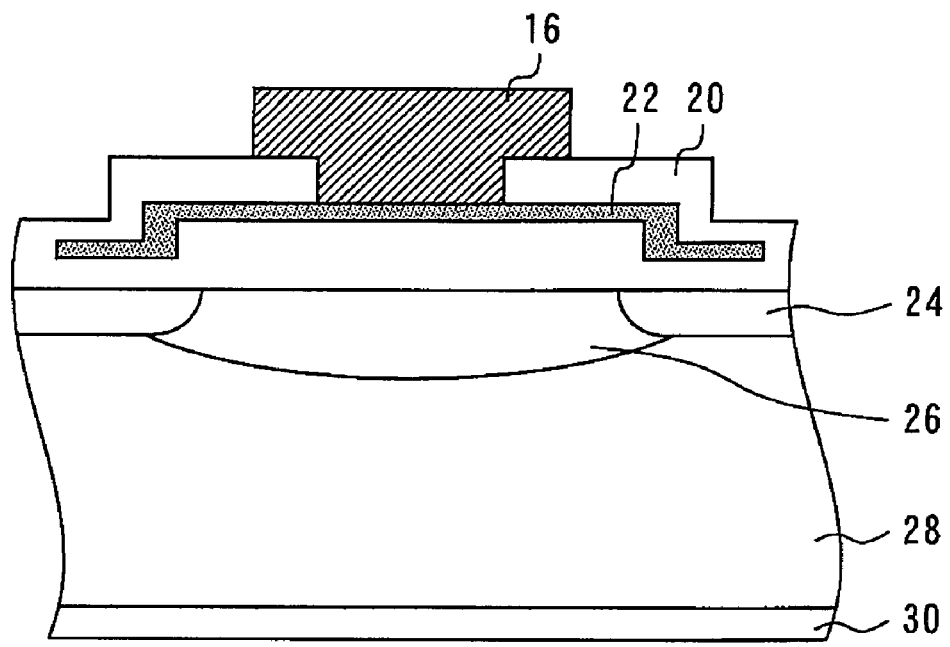
FIG. 2 is a cross-sectional view taken along dashed line II-II of FIG. 1.

FIG. 2 is a cross-sectional view taken along dashed line II-II of FIG. 1. In this cross-section, the semiconductor device 10 includes an n-layer 28. A base layer 24 and a P-well 26 are formed in the n-layer 28. The insulating film 20 is formed on the top side of the n-layer 28 and is in contact with the base layer 24 and the P-well 26. The insulating film 20 covers a gate electrode 22. The gate electrode 22 is made of impurity doped polysilicon. The gate pad 16 is formed on the gate electrode 22. On the other hand, a collector electrode 30 is formed on the bottom side of the n-layer 28.

Figure 3:
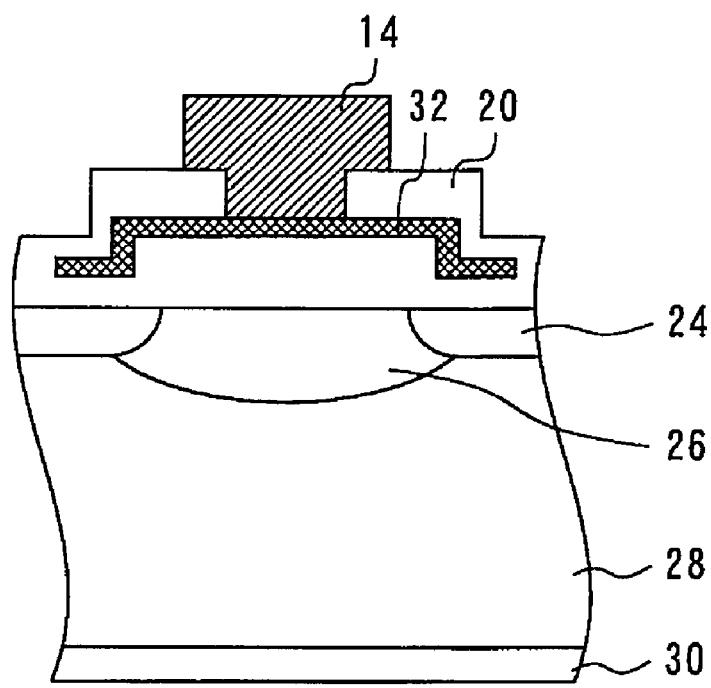
FIG. 3 is a cross-sectional view taken along dashed line III-III of FIG. 1.

FIG. 3 is a cross-sectional view taken along dashed line III-III of FIG. 1. In this cross-section, a gate electrode 32 is formed under the gate wiring conductor 14. The gate electrode 32 is made of impurity doped polysilicon. The gate electrode 32 has a higher impurity concentration than the gate electrode 22. Therefore, the gate electrode 32 has a lower resistivity (and hence a lower resistance per unit area) than the gate electrode 22.

Figure 4:
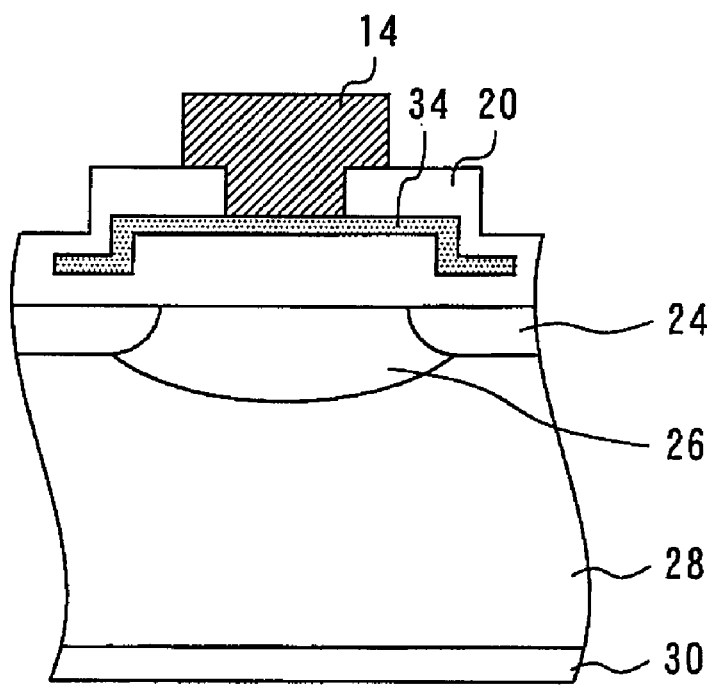
FIG. 4 is a cross-sectional view taken along IV-IV of FIG. 1.

FIG. 4 is a cross-sectional view taken along IV-IV of FIG. 1. In this cross-section, a gate electrode 34 is formed under the gate wiring conductor 14. The gate electrode 34 is made of impurity doped polysilicon. The gate electrode 34 has a higher impurity concentration than the gate electrode 32. Therefore, the gate electrode 34 has a lower resistivity (and hence a lower resistance per unit area) than the gate electrode 32. Thus, the gate electrodes 22, 32, and 34 are of increasing resistivity (and hence increasing resistance per unit area) as they are closer to the gate pad 16. That is, gate electrodes closer to the gate pad 16 have a higher resistance per unit area than gate electrodes farther away from the gate pad 16.

Figure 5:
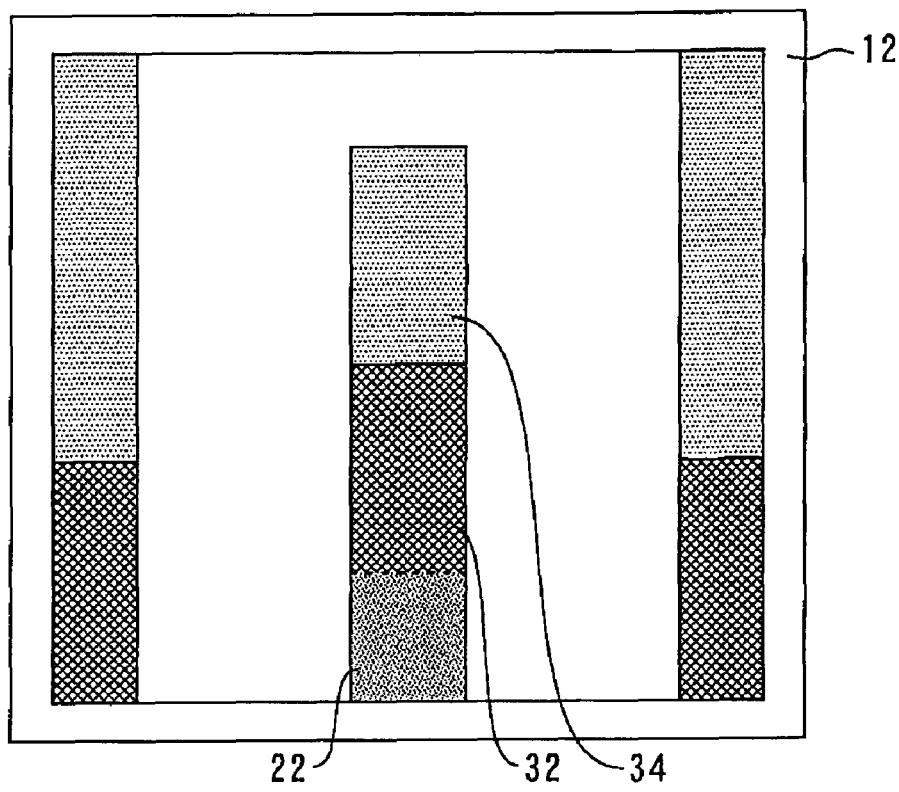
FIG. 5 is a plan view of the semiconductor device showing only the gate electrodes and the dielectric strength enhancing region.

FIG. 5 is a plan view of the semiconductor device 10 showing only the gate electrodes 22, 32, and 34 and the dielectric strength enhancing region 12. As shown in FIG. 5, the gate electrodes 22, 32, and 34 are formed in a striped configuration. The gate electrode 22 lies immediately under the gate pad 16. The gate electrode 32 is disposed close to the gate electrode 22, and the gate electrode 34 is disposed away from the gate electrode 22. Thus, the gate electrode 22, which has a high resistance per unit area, is formed immediately under the gate pad 16; the gate electrode 32, which has a lower resistance per unit area than the gate electrode 22, is formed close to the gate electrode 22; and the gate electrode 34, which has a lower resistance per unit area than the gate electrode 32, is formed away from the gate electrode 22.

Figure 6:
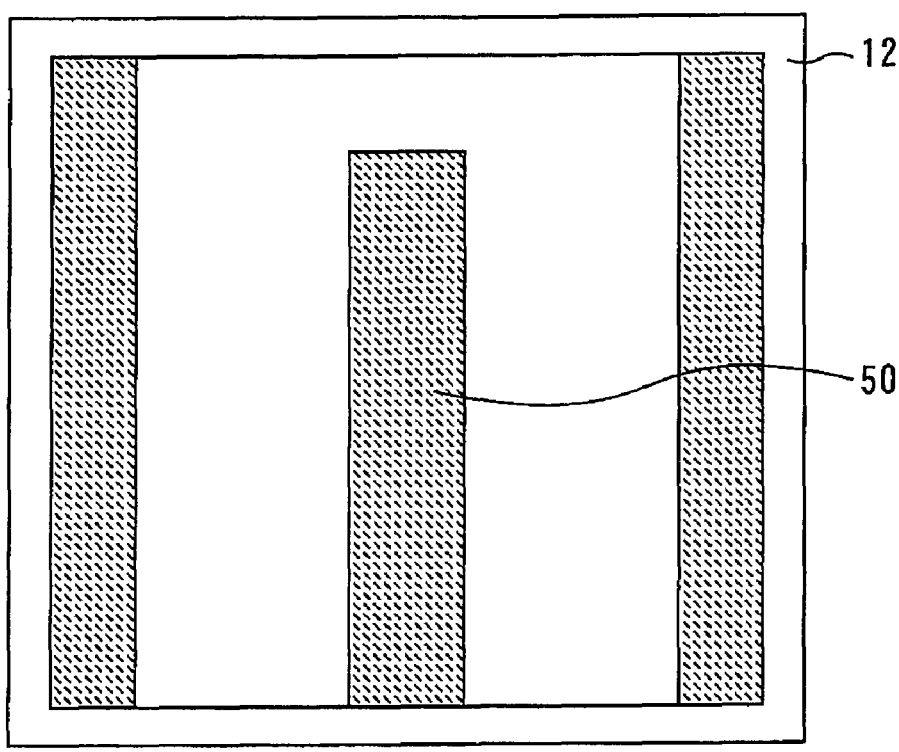
FIG. 6 is a plan view of the gate electrode of this comparative semiconductor device.

Before describing the operation of the present embodiment, and to facilitate the understanding thereof, the following description will be directed to a comparative conventional semiconductor device. FIG. 6 is a plan view of the gate electrode 50 of this comparative semiconductor device (which electrode corresponds to the combination of the electrodes 22, 32, and 34 of the semiconductor device 10 of the present embodiment). The gate electrode 50 of this comparative semiconductor device has a uniform resistivity (and hence a uniform resistance per unit area). Except for this feature, this comparative semiconductor device is similar in construction to the semiconductor device of the present embodiment.

Figure 7:
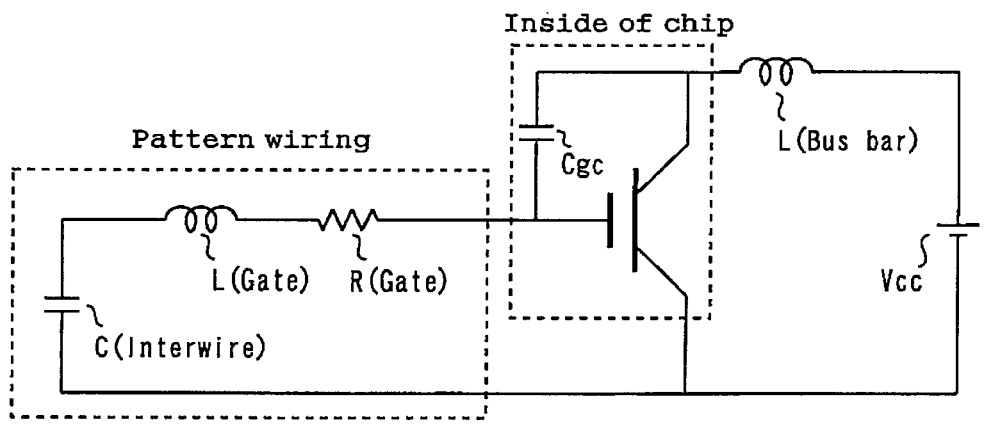
FIG. 7 is a circuit diagram of an exemplary Hartley oscillator circuit which can be formed in the comparative semiconductor device.

In the case of the comparative semiconductor device, a Hartley oscillator circuit might be formed in the device and go into short-circuit oscillation. FIG. 7 is a circuit diagram of an exemplary Hartley oscillator circuit which can be formed in the comparative semiconductor device. In this figure, the reference symbols R (Gate) and L (Gate) denote the gate resistance and the inductance of the gate wiring conductor, respectively. Further, the reference symbol C (Interwire) denotes the capacitance between the emitter electrode and the gate electrode. The reference symbol L (Bus bar) denotes the inductance of the bus bar connected to the power MOSFET, and Vcc denotes the DC voltage applied to the power MOSFET. The reference symbol Cgc denotes the gate-collector capacitance, which acts as a capacitance of the Hartley oscillator circuit. It should be noted that the lower the gate resistance R (Gate), the more likely it is that a Hartley oscillator circuit will be formed and go into oscillation.

Figure 8:
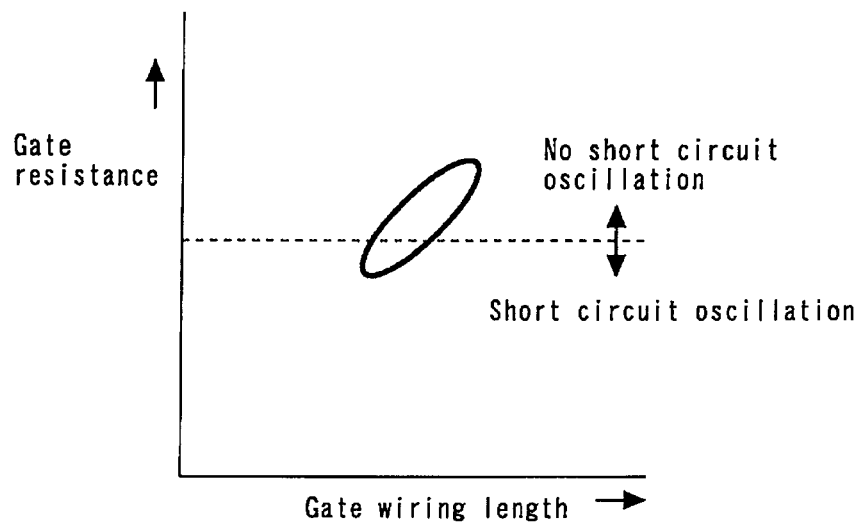
FIG. 8 is a diagram showing whether short-circuit oscillation occurs in the comparative semiconductor device, as a function of the gate wiring length.

Incidentally, when the gate electrode has a uniform resistance per unit area, as in the comparative semiconductor device, the gate resistance increases with the gate wiring length. That is, portions of the device closer to the gate pad (and therefore having a shorter gate wiring length) have a lower gate resistance than portions farther away from the gate pad. This means that when the gate electrode has a uniform resistance per unit area, it is likely that a Hartley oscillator circuit will be formed near the gate pad and go into short-circuit oscillation. FIG. 8 is a diagram showing whether short-circuit oscillation occurs in the comparative semiconductor device, as a function of the gate wiring length. As can be seen from this figure, short-circuit oscillation occurs when the gate wiring length is short (that is, occurs near the gate pad).

On the other hand, the construction and arrangement of the gate electrodes of the semiconductor device 10 of the present embodiment prevents formation of a Hartley oscillator circuit. Specifically, since in the semiconductor device 10 gate electrodes closer to the gate pad 16 have a higher resistivity (and hence a higher resistance per unit area) than gate electrodes farther away from the gate pad 16, the portion of the device close to the gate pad 16 has a high gate resistance, thereby preventing a Hartley oscillation from occurring near the gate pad 16.

Figure 9:
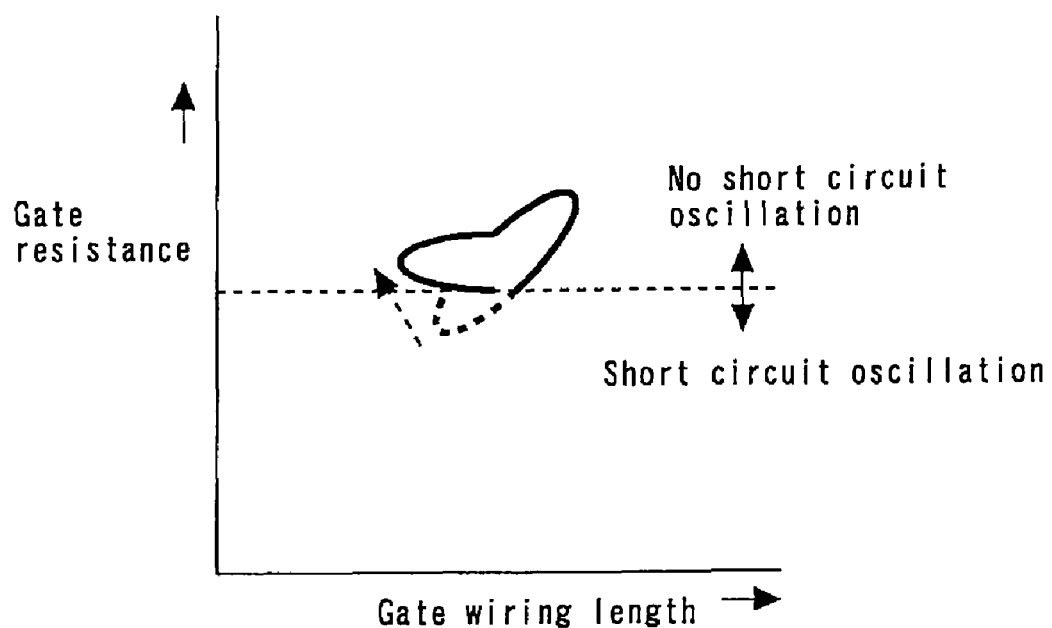
FIG. 9 is a diagram showing whether short-circuit oscillation occurs in the semiconductor device of the present embodiment, as a function of the gate wiring length.

FIG. 9 is a diagram showing whether short-circuit oscillation occurs in the semiconductor device 10 of the present embodiment, as a function of the gate wiring length. This figure shows that in the case of the semiconductor device 10 it is possible to prevent the occurrence of short-circuit oscillation even near the gate pad 16 (that is, even when the gate wiring length is short). This results from the fact that gate electrodes closer to the gate pad 16 have a higher resistance per unit area than gate electrodes farther away from the gate pad 16 (that is, results from the fact that the portion of the device close to the gate pad 16 and therefore having a short gate wiring length has an increased gate electrode resistance). FIG. 9 shows this effect. In FIG. 9, the thick dashed curve represents the case where all gate electrodes have the same uniform resistance per unit area, and the solid line represents the case where gate electrodes closer to the gate pad 16 have a higher resistance per unit area than gate electrodes farther away from the gate pad 16.

Figure 10:
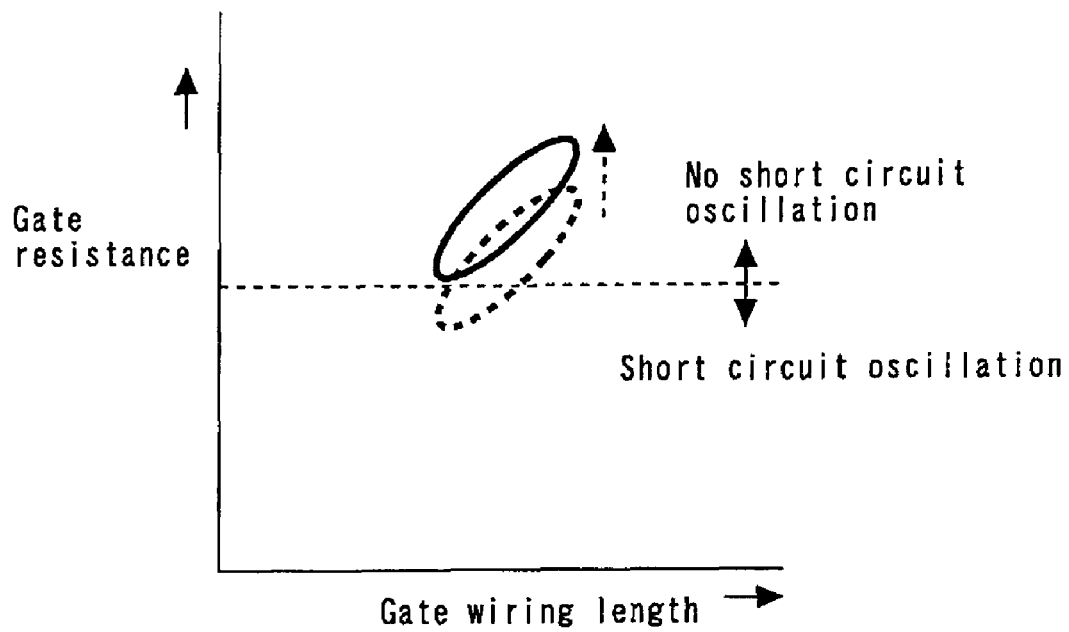
FIG. 10 is a diagram showing how increases in the resistance per unit area of the entire gate electrode results in prevention of short-circuit oscillation.

It should be noted that the resistance per unit area of the entire gate electrode of the comparative semiconductor device may be increased to prevent short-circuit oscillation. FIG. 10 is a diagram showing how increases in the resistance per unit area of the entire gate electrode results in prevention of short-circuit oscillation. In FIG. 10, the thick dashed curve represents the case where the gate electrode has a first resistance per unit area, and the solid curve represents the case where the gate electrode has a second resistance per unit area higher than the first resistance per unit area. As shown, short-circuit oscillation can be prevented by increasing the resistance per unit area of the entire gate electrode and thereby increasing the gate resistance. This, however, results in a decrease in the switching speed of the device.

On the other hand, the construction and arrangement of the gate electrodes of the semiconductor device 10 of the present embodiment ensures that the device has a high switching speed, as well as exhibiting reduced short-circuit oscillation. Specifically, in the semiconductor device 10, gate electrodes closer to the gate pad 16 have a higher resistivity (and hence a higher resistance per unit area) than gate electrodes farther away from the gate pad 16. That is, the portion of the device away from the gate pad 16 has a low gate resistance, as compared to when all gate electrodes have an increased resistance per unit area. As a result, the semiconductor device 10 has a high switching speed, as well as exhibiting reduced short-circuit oscillation.

Various alterations may be made to the present invention. For example, the impurity doping of the gate electrodes 22, 32, and 34 may be accomplished through ion implantation. The gate electrodes may be made of metal instead of polysilicon. Further, the present invention may be applied to IGBTs instead of power MOSFETs.

In the present embodiment, the gate electrodes are made to have different resistances per unit area by adjusting the amounts of impurity doped in the gate electrodes. However, the present invention is not limited to this particular method. For example, in order that the gate electrodes have different resistances per unit area, they may be formed so that gate electrodes closer to the gate pad are thinner than those farther away from the gate pad.

Although in the present embodiment the semiconductor device 10 has 3 types of gate electrodes (namely, the gate electrodes 22, 32, and 34), it is to be understood that the device may have two types of gate electrodes or four or more types of gate electrodes, with the same effect.

Thus the present invention enables the manufacture of semiconductor devices which exhibit reduced short-circuit oscillation yet have a high switching speed.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-160544, filed on Jul. 15, 2010 including specification, claims, drawings and summary, on which the Convention priority of the present application is based, are incorporated herein by reference in its entirety.

What is claimed is:

1. A semiconductor device comprising:
   a gate pad;
   a gate wiring conductor connected to said gate pad; and
   a gate electrode formed under said gate pad and said gate wiring conductor;
   wherein portions of said gate electrode closer to said gate pad have a higher resistance per unit area than portions of said gate electrode farther away from said gate pad.

2. The semiconductor device according to claim 1, wherein:
   said gate electrode is impurity doped polysilicon; and
   portions of said gate electrode closer to said gate pad have a lower impurity concentration than portions of said gate electrode farther away from said gate pad.

3. The semiconductor device according to claim 1, wherein portions of said gate electrode closer to said gate pad are thinner than portions of said gate electrode farther away from said gate pad.

* * * * *